United States Patent [19]

Hong

[11] Patent Number: 5,757,064
[45] Date of Patent: May 26, 1998

[54] MULTLAYER INTERCONNECTION STRUCTURE FOR SEMICONDUCTOR DEVICE

[75] Inventor: Ki Gak Hong, Chungcheongbuk-do, Rep. of Korea

[73] Assignee: LG Semicon Co., Ltd., Chungcheongbuk-Do, Rep. of Korea

[21] Appl. No.: 662,320

[22] Filed: Jun. 13, 1996

[30] Foreign Application Priority Data

Dec. 27, 1995 [KR] Rep. of Korea ............ 1995/58902

[51] Int. Cl.$^6$ ............................................. H01L 22/58
[52] U.S. Cl. ............................ 257/635; 257/641; 257/645; 257/752; 257/754; 257/774
[58] Field of Search ............................ 257/635, 637, 257/641, 644, 748, 752, 754, 758, 763, 774, 645

[56] References Cited

U.S. PATENT DOCUMENTS 5,128,744   7/1992   Asano et al. ............................ 427/200
5,244,820   9/1993   Kamata et al. ............................ 437/20

Primary Examiner—Tom Thomas
Assistant Examiner—Fetsum Abraham
Attorney, Agent, or Firm—Morgan, Lewis & Bockius LLP

[57] ABSTRACT

A structure for a semiconductor device includes a plurality of memory cell areas, a multilayer interconnection structure including an interfacial insulating film and connecting the plurality of memory cell areas, the multilayer interconnection structure being insulated and planarized by the interfacial insulating film, and peripheral circuits adjacent to the plurality of memory cell areas, the peripheral circuits intersecting at a portion, wherein the multilayer interconnection structure includes an inflow-preventing layer for preventing an inflow of the interfacial insulating film at the portion where the peripheral circuits intersect.

19 Claims, 3 Drawing Sheets

MULTLAYER INTERCONNECTION STRUCTURE FOR SEMICONDUCTOR DEVICE

BACKGROUND OF THE INVENTION

1. Field of the Invention

The present invention relates to a structure for a semiconductor device, and more particularly, to a multilayer interconnection structure for a semiconductor device.

2. Discussion of the Related Art

In general, a multilayer interconnection technique is used for making integrated circuits (ICs) having a multilayer structure. During the fabrication process of semiconductor devices with high integration, this technique provides more freedom for arranging and combining different electrical elements on a substrate than other techniques. Such a conventional multilayer interconnection technique was proposed and applied to fabrication processes of integrated circuits in the late 1960's.

In the 1970's, both bipolar large scale integrated circuits (LSIs) and silicon gate MOS (metal-oxide semiconductor) LSIs were introduced in which the multilayer interconnection technique is widely applied during the fabrication processes of ICs. Additional new technologies for making the multilayer interconnection structure were also developed in the 1970's.

Today, the basic structure and manufacturing methods of various integrated circuits are substantially similar to one another. The multilayer interconnection technique has been used as an important process to improve the production yield and the reliability of a semiconductor device.

A conventional multilayer interconnection structure for a semiconductor device will now be described with reference to FIGS. 1–3.

FIG. 1 shows the layout of a conventional semiconductor device; FIG. 2 shows a transverse cross-sectional view taken along the line I–I' in FIG. 1, showing a conventional multilayer interconnection structure; and FIG. 3 is a cross-sectional view illustrating the degradation of the conventional multilayer interconnection structure.

As shown in FIG. 2, a semiconductor device having a multilayer interconnection structure includes the following: a P-type well 1 (or N-type well) formed on a semiconductor substrate; a field oxide film 2 formed in a predetermined area for isolation of electrical elements within the P-type well 1 (or N-type well); a high-density impurity region 3 formed by ion implantation in an active region of the P-type well 1 where the field oxide film 2 is not formed; a first oxide film 4 deposited by a low-pressure chemical vapor deposition method (LPCVD) over the substrate to achieve a surface passivation; a first borophosphosilicate glass (BPSG) layer 5 formed by an atmospheric pressure chemical vapor deposition method (APCVD) on the first oxide film 4 as an insulating film for planarization through a reflow process; a lower metal line 6 of tungsten polycide formed on the first BPSG layer 5; a second oxide film 7 for insulating the lower metal line 6; a second BPSG layer 8 deposited on the second oxide film 7 by APCVD, and then formed by a reflow process to planarize the surface; and an upper metal line 9 in ohmic-contact with the high-density impurity region 3 through a contact hole.

The lower part of the upper metal line 9 that comes in ohmic-contact with the high-density impurity region 3 is made of a barrier metal, and the upper part of the upper metal line 9 is made of a material with a low sheet resistance.

The above-described multilayer interconnection structure having BPSG layers as insulating films for planarization has the following problems.

The second BPSG layer 8 is formed as an insulating film for making the upper metal line 9 during the manufacturing process, and a reflow process is then necessary for planarization. As shown in FIG. 3, the lower metal line 6 of tungsten polycide is pushed toward a contact region "a" of the upper metal line 9 due to an inflow of the first BPSG layer 5. Since the height of horizontal and vertical peripheral circuits is lower than that of a memory cell area, the inflow of the BPSG layer frequently occurs in an intersecting portion such as region "P" in FIG. 1, where the horizontal and vertical peripheral circuits intersect. In addition, the inflow of the BPSG layer causes an electrical short-circuit between the metal lines, thereby decreasing production yield and reliability of semiconductor devices.

SUMMARY OF THE INVENTION

Accordingly, the present invention is directed to a multilayer interconnection structure for a semiconductor device that substantially obviates one or more of the problems due to limitations and disadvantages of the related art.

An object of the present invention is to provide a multilayer interconnection structure for a semiconductor device that prevents inflow of a BPSG layer, thereby enhancing reliability and production yield of semiconductor devices.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, a structure for a semiconductor device of the present invention includes a plurality of memory cell areas, a multilayer interconnection structure including an interfacial insulating film and connecting the plurality of memory cell areas, the multilayer interconnection structure being insulated and planarized by the interfacial insulating film, and peripheral circuits adjacent to the plurality of memory cell areas, the peripheral circuits intersecting at a portion, wherein the multilayer interconnection structure includes an inflow-preventing layer for preventing an inflow of the interfacial insulating film at the portion where the peripheral circuits intersect.

In another aspect, a multilayer interconnection structure for connecting a plurality of memory cell areas in a semiconductor device according to the present invention includes a semiconductor substrate having a field region and an active region, a well having a first polarity on the semiconductor substrate, a field oxide film in the field region, a high-density impurity region in the active region, a polysilicon film on a portion of the field oxide film, a first insulation film on the polysilicon film, the field oxide film, and the high-density impurity region, a first interfacial insulation layer on the first insulation film, a plurality of contact holes in the first interfacial insulation layer, the contact holes exposing the polysilicon film and the high-density impurity region, a first metal line on the first interfacial insulation layer above the high-density impurity region, an inflow-preventing layer on the polysilicon film occupying the plurality of contact holes exposing the polysilicon film, a second insulation film on the first metal line and the inflow-preventing layer, a second interfacial insulation layer on the second insulation film, and a second metal line in ohmic-contact with the high-density impurity region through one of the contact holes exposing the high-density impurity region.

In a further aspect, the present invention includes a semiconductor device having a plurality of memory cell areas connected therebetween by a multilayer interconnection structure to be insulated and planarized by an interfacial insulating film, peripheral circuits to be separated from the plurality of memory cell areas, and an inflow preventing layer for precluding the inflow of the interfacial insulating film at a certain area in which the peripheral circuits intersect.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
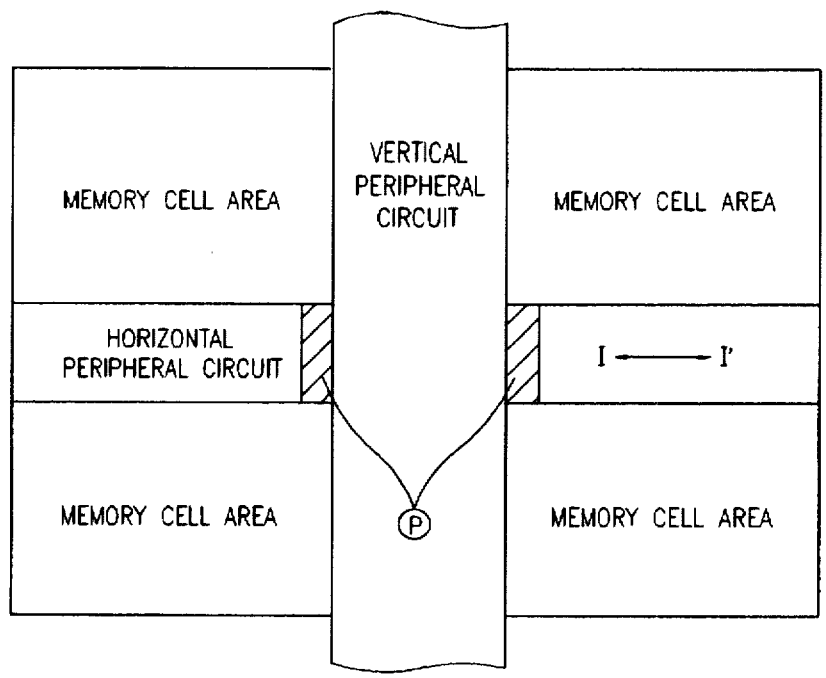
FIG. 1 is a layout of a conventional semiconductor device.
Figure 2:
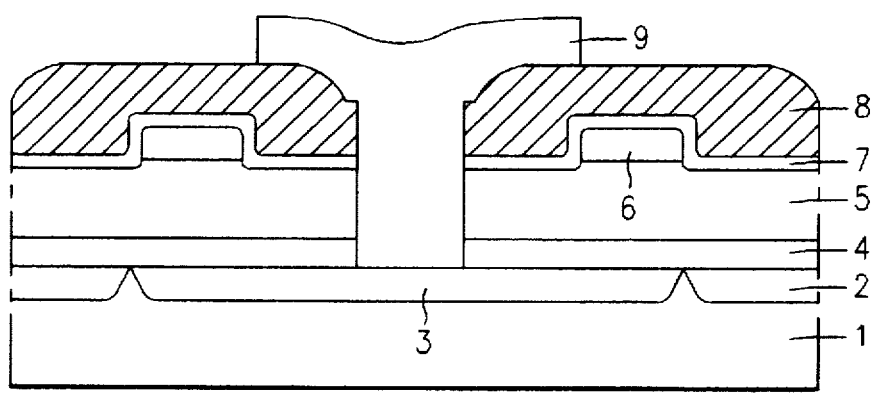
FIG. 2 is a transverse cross-sectional view taken along the line I-I' of FIG. 1, showing a conventional multilayer interconnection structure.
Figure 3:
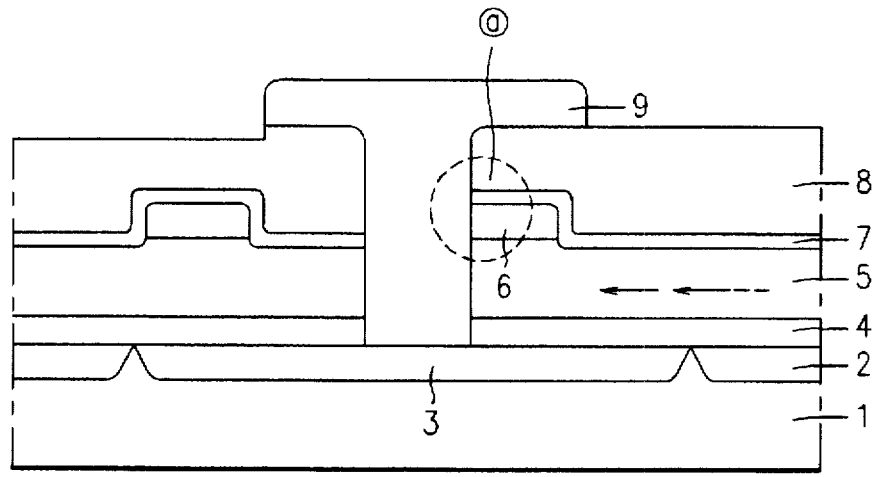
FIG. 3 is a cross-sectional view illustrating the degradation of the conventional multilayer interconnection structure.
Figure 4:
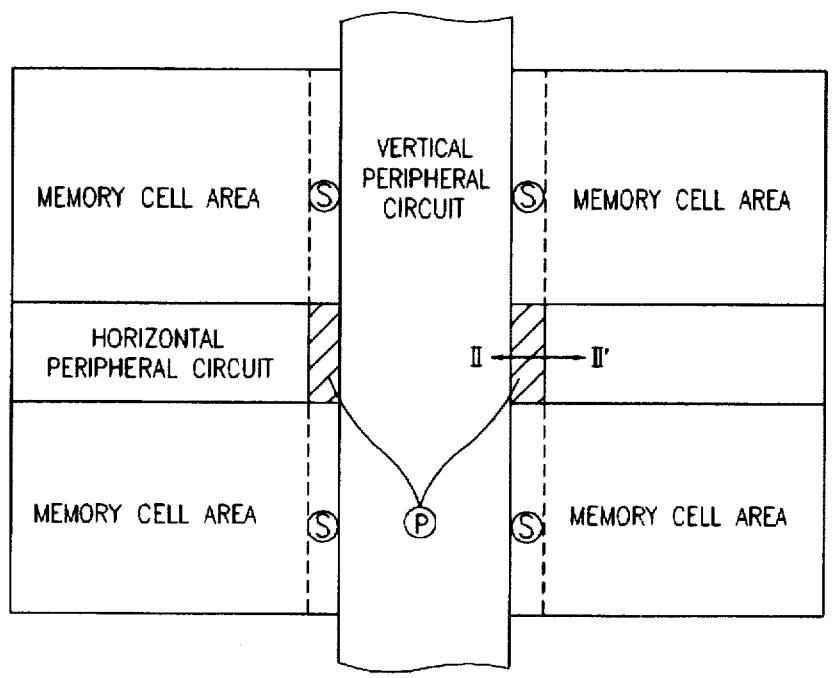
FIG. 4 is a layout of a semiconductor device in accordance with a preferred embodiment of the present invention.

In the present invention, a multilayer interconnection structure prevents degradation caused by an inflow of a first BPSG layer during a reflow process of a second BPSG layer. Referring to FIG. 4, an inflow-preventing layer (against inflow of the BPSG layer) is formed at an intersecting portion "R" between horizontal and vertical peripheral circuits where the height is lower than that of the memory cell area. In addition to the intersecting portion "R", the inflow-preventing layer can be formed at portions labelled as "S" in FIG. 4. The "S" portions include a step-like difference in height between memory cell areas and vertical peripheral circuits.

Figure 5A:
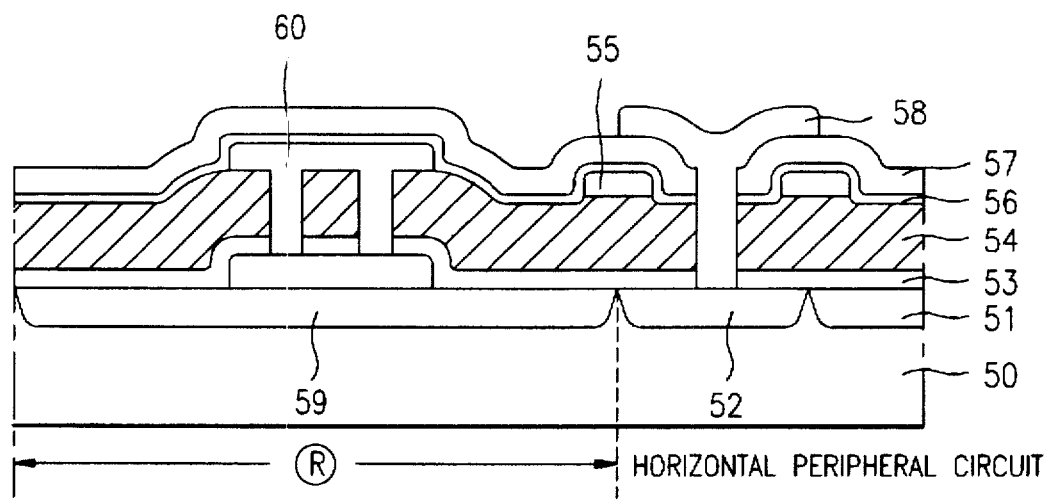
FIG. 5A is a transverse cross-sectional view taken along the line II-II' of FIG. 4, showing a multilayer interconnection structure in accordance with a preferred embodiment of the present invention.

As shown in FIG. 5A, a semiconductor device having the multilayer interconnection structure according to the present invention includes the following elements: a P-type well 50 (or N-type well) formed on a semiconductor substrate, a field oxide film 51 formed on a predetermined area for isolation of electrical elements within the P-type well 50 (or N-type well), and a high-density impurity region 52 formed by ion implantation in an active region of the P-type well 50 where the field oxide film 51 is not formed. The multilayer interconnection structure also includes an impurity-doped polysilicon film 59 formed on the field oxide film 51 at an intersecting region "R" between memory cell area's. The polysilicon film 59 serves as a gate for transistors formed in each memory cell area. The multilayer interconnection structure further includes a first oxide film 53 formed by LPCVD on the entire surface to achieve a surface passivation, and a first BPSG layer 54 formed by APCVD on the first oxide film 53 as an insulating film for planarization resulting from a reflow process. A plurality of contact holes are formed in the first BPSG layer 54 in an area above the polysilicon film 59. A lower metal line 55 of tungsten polycide is formed on the first BPSG layer 54 in an area above the high-density impurity region 52. An inflow-preventing layer 60 of tungsten polycide is formed on the polysilicon film 59, occupying the plurality of contact holes. A second oxide film 56 is formed both on the lower metal line 55 and the inflow-preventing layer 60 to achieve an interfacial insulation. A second BPSG layer 57 is formed on the second oxide film 56 by APCVD and then treated through a reflow process for planarization. An upper metal line 58 is formed to be in ohmic-contact with the high-density impurity region 52 through a contact hole located on the high-density impurity region 52.

The lower part of the upper metal line 58 that comes in ohmic-contact with the high-density impurity region 52 is made of a barrier metal. The upper part of the upper metal line 58 is made of a material having a low sheet resistance.

Accordingly, the present invention provides a multilayer interconnection structure for a semiconductor device which prevents inflow of a BPSG layer by providing a post of tungsten polycide to an area in which inflow of a BPSG layer frequently occurs (that is, to an intersecting portion between peripheral circuits), thereby enhancing reliability and production yield of semiconductor devices.

Figure 5B:
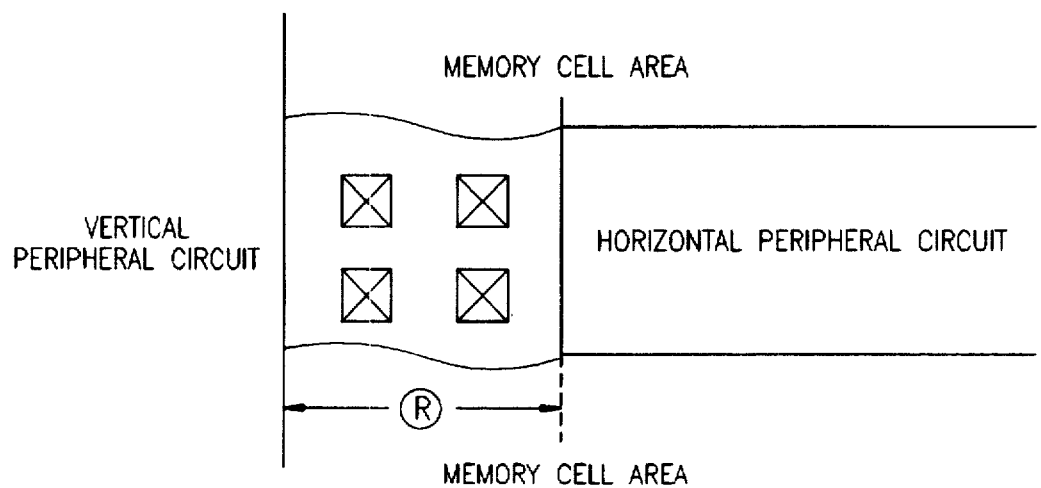
FIG. 5B is a layout of an inflow preventing layer for preventing an inflow of a BPSG layer in accordance with a 5 preferred embodiment of the present invention.

As shown in FIG. 5B, the multilayer interconnection structure for a semiconductor device of the present invention has advantages as follows. First, a post of tungsten polycide is provided at the intersecting portion "R" between horizontal and vertical peripheral circuits. This prevents the inflow of the lower BPSG layer during a reflow process of an interfacial insulating film (i.e., the upper BPSG layer) for planarization to form the upper metal line. Thus, the present invention prevents degradation of electrical devices and increases production yield and reliability of semiconductor devices. Second, the intersecting portion between the peripheral circuits usually has a space margin. Thus, it is unlikely that forming of the inflow-preventing layer will increase the size of a chip. In addition, when depositing a BPSG layer whose inflow degree is changed by boron concentration, a processing margin as to the boron concentration can be increased.

It will be apparent to those skilled in the art that various modifications and variations can be made in the multilayer interconnection structure for a semiconductor device of the present invention without departing from the spirit of scope of the invention. Thus, it is intended that the present invention cover the modifications and variations of this invention provided they come within the scope of the appended claims and their equivalents.

What is claimed is:

1. A semiconductor device comprising:

a plurality of memory cell areas;

a multilayer interconnection structure including an interfacial insulating film and connecting the plurality of memory cell areas, the multilayer interconnection structure being insulated and planarized by the interfacial insulating film; and peripheral circuits adjacent to the plurality of memory cell areas, the peripheral circuits intersecting at a portion;

a field oxide film at an intersecting area between the memory cell areas:

wherein the multilayer interconnection structure includes an inflow-preventing layer for preventing an inflow of the interfacial insulating film at the portion between the peripheral circuits; and wherein the inflow-preventing layer contacts a semiconductor film formed on the field oxide film through at least one contact hole formed on the interfacial insulating film.

2. The semiconductor device as claimed in claim 1, wherein the memory cell areas have a first height and the peripheral circuits have a second height, the first height being higher than the second height.

3. The semiconductor device as claimed in claim 1, wherein the interfacial insulating film includes borophosphosilicate glass.

4. The semiconductor device as claimed in claim 1, wherein the inflow preventing layer includes tungsten polycide.

5. The semiconductor device as claimed in claim 1, further comprising a lower metal line above a first portion of the interfacial insulating film, the inflow-preventing layer being on a second portion of the interfacial insulating film, the interfacial insulating film planarizing the lower metal line.

6. The semiconductor device as claimed in claim 5, wherein the semiconductor film includes a polysilicon film doped with an impurity.

7. A semiconductor device comprising:

a plurality of memory cell areas separated by peripheral circuits;

a multilayer interconnection structure connecting the plurality of memory cell areas, the multilayer interconnection structure including an interfacial insulating film and an inflow-preventing layer for preventing an inflow of the interfacial insulating film at a portion between the peripheral circuits; and a semiconductor film formed on a field oxide film, the inflow-preventing layer contacting the semiconductor film through at least one contact hole.

8. The semiconductor device as claimed in claim 7, wherein the interfacial insulating film insulates and planarizes the multilayer interconnection structure.

9. The semiconductor device as claimed in claim 7, wherein the memory cell areas have a first height and the peripheral circuits have a second height, the first height being higher than the second height.

10. The semiconductor device as claimed in claim 7, wherein the interfacial insulating film includes borophosphosilicate glass.

11. The semiconductor device as claimed in claim 7, wherein the inflow preventing layer includes tungsten polycide.

12. The semiconductor device as claimed in claim 7, wherein the semiconductor film includes a polysilicon film doped with an impurity.

13. A multilayer interconnection structure for connecting a plurality of memory cell areas in a semiconductor device comprising:

a semiconductor substrate having a field region and an active region;

a well having a first polarity on the semiconductor substrate;

a field oxide film in the field region;

a high-density impurity region in the active region;

a polysilicon film on a portion of the field oxide film;

a first insulation film on the polysilicon film, the field oxide film, and the high-density impurity region;

a first interfacial insulation layer on the first insulation film;

a plurality of contact holes in the first interfacial insulation layer, the contact holes exposing the polysilicon film and the high-density impurity region;

a first metal line on the first interfacial insulation layer above the high-density impurity region;

an inflow-preventing layer on the polysilicon film occupying the plurality of contact holes exposing the polysilicon film;

a second insulation film on the first metal line and the inflow-preventing layer;

a second interfacial insulation layer on the second insulation film; and a second metal line in ohmic-contact with the high-density impurity region through one of the contact holes exposing the high-density impurity region.

14. The multilayer interconnection structure as claimed in claim 13, wherein the portion of the field oxide film includes an intersecting region between the plurality of memory cell areas.

15. The multilayer interconnection structure as claimed in claim 13, wherein the first insulation film and the second insulation film each includes an oxide film.

16. The multilayer interconnection structure as claimed in claim 13, wherein the first metal line includes tungsten polycide.

17. The multilayer interconnection structure as claimed in claim 13, wherein the inflow-preventing layer includes tungsten polycide.

18. The multilayer interconnection structure as claimed in claim 13, wherein a first part of the second metal line includes a barrier metal, and a second part of the second metal line includes a material having a low sheet resistance.

19. The multilayer interconnection structure as claimed in claim 13, wherein the first interfacial insulation layer and the second interfacial insulation layer each includes a borophosphosilicate glass layer.

* * * * *